United States Patent
Brehm et al.

(10) Patent No.: US 10,103,085 B2
(45) Date of Patent: Oct. 16, 2018

(54) CLAMPING ASSEMBLY HAVING A PRESSURE ELEMENT

(71) Applicant: SIEMENS AKTIENGESELLSCHAFT, Munich (DE)

(72) Inventors: Holger Siegmund Brehm, Erlangen (DE); Matthias Boehm, Neuendettelsau (DE); Daniel Schmitt, Nuremberg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 15/323,340

(22) PCT Filed: Jul. 1, 2014

(86) PCT No.: PCT/EP2014/063954
§ 371 (c)(1),
(2) Date: Dec. 30, 2016

(87) PCT Pub. No.: WO2016/000762
PCT Pub. Date: Jan. 7, 2016

(65) Prior Publication Data
US 2017/0162470 A1    Jun. 8, 2017

(51) Int. Cl.
*H03K 17/60* (2006.01)
*H01L 23/40* (2006.01)
*H03K 17/567* (2006.01)

(52) U.S. Cl.
CPC ....... *H01L 23/4012* (2013.01); *H03K 17/567* (2013.01); *H01L 2023/4025* (2013.01)

(58) Field of Classification Search
CPC .................................................. H01L 23/4012
See application file for complete search history.

(56) References Cited

U.S. PATENT DOCUMENTS

| | | |
|---|---|---|
| 4,918,514 A | 4/1990 | Matsuda et al. |
| 5,119,175 A | 6/1992 | Long et al. |
| 6,642,576 B1 | 11/2003 | Shirasawa et al. |
| 6,686,658 B2 * | 2/2004 | Kodama ......... H01L 24/72 257/118 |
| 2003/0129863 A1 | 7/2003 | Alcoe et al. |

FOREIGN PATENT DOCUMENTS

| | | |
|---|---|---|
| CN | 101593748 A | 12/2009 |
| CN | 201780970 U | 3/2011 |
| DE | 10103031 A1 | 7/2002 |

(Continued)

*Primary Examiner* — Daniel Puentes
(74) *Attorney, Agent, or Firm* — Laurence Greenberg; Werner Stemer; Ralph Locher

(57) ABSTRACT

A clamping assembly includes a configuration of mechanically clamped components disposed one on top of the other to form a stack. A clamping device generates a mechanical compressive force on the configuration of the components and a pressure element transmits the mechanical compressive force from the clamping device to the configuration. The pressure element contains a metal foam for a planar, homogeneous transmission of the compressive force. A sub module of a converter having at least one series circuit of power semiconductor switching units implemented as the clamping apparatus is also provided.

9 Claims, 1 Drawing Sheet

(56) References Cited

FOREIGN PATENT DOCUMENTS

| | | |
|---|---|---|
| DE | 102006031213 B3 | 9/2007 |
| DE | 102011006990 A1 | 10/2012 |
| EP | 0285074 A2 | 10/1988 |
| EP | 0932201 A2 | 7/1999 |
| EP | 1403923 A1 | 3/2004 |
| WO | 2008031370 A1 | 3/2008 |
| WO | 2013044409 A1 | 4/2013 |

* cited by examiner

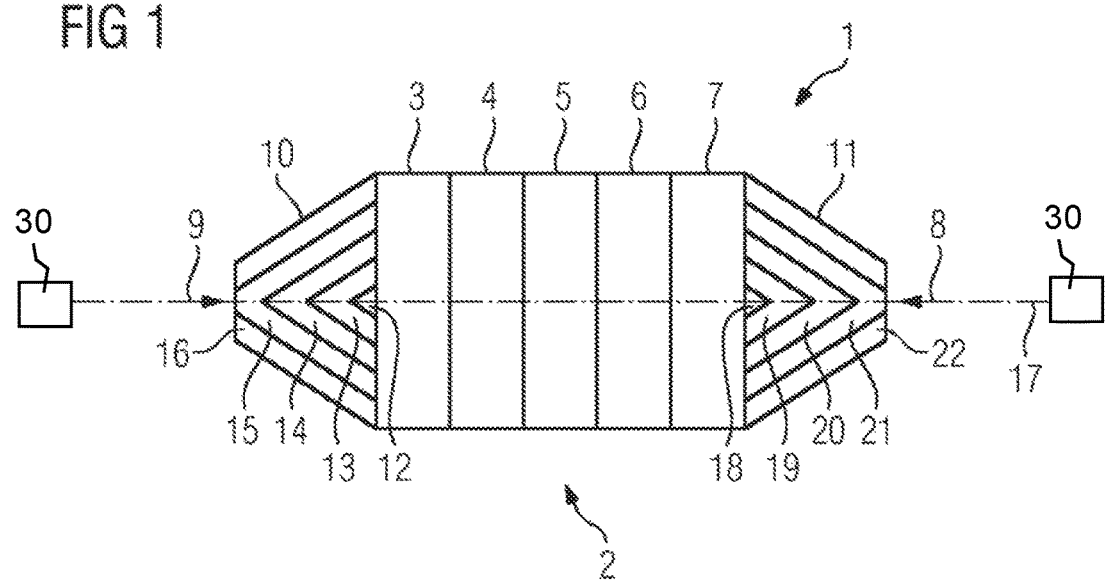
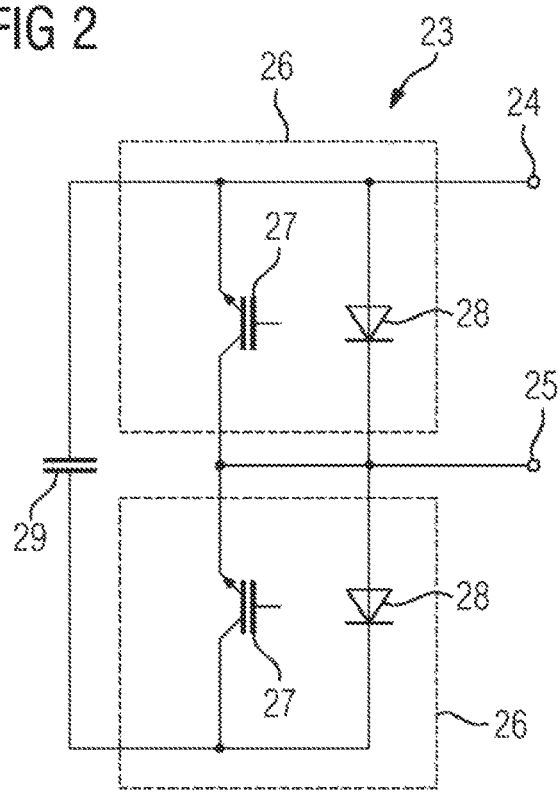

CLAMPING ASSEMBLY HAVING A PRESSURE ELEMENT

BACKGROUND OF THE INVENTION

Field of the Invention

The invention concerns a clamping assembly with an arrangement of mechanically clamped components positioned above one another in a stack, a clamping device for generating mechanical compressive force on the arrangement of the components, and a pressure element for transferring the mechanical compressive force from the clamping device to the arrangement.

Clamping assemblies of this type known from the prior art.

Document DE 10 2011 006 990 A1 describes a column clamping assembly in which power diodes arranged above one another in a stack and heat sinks are clamped together mechanically by means of pressure elements designed as pressure plates and clamping screws. The compressive force generated by means of the clamping screws is thus transmitted to the pressure plates at specific points. In the known clamping assembly this leads to a non-homogeneous pressure distribution. The pressure generated in the region of a central axis of the column clamping assembly is significantly higher than that in its edge regions.

BRIEF SUMMARY OF THE INVENTION

The object of the invention is to propose a clamping assembly of the type described above with which the transmission of the compressive force is as homogeneous as possible.

The object is achieved according to the invention at a clamping assembly by a pressure element that contains a metal foam material.

Through the use of the metal foam material, whose elastic properties can be selectively controlled and influenced through appropriate manufacture, a relatively homogeneous pressure distribution in the transmission of the compressive forces to the arrangement of the components can be achieved. This is of particular significance when the components are, for example, semiconductor chips connected in parallel which have a relatively large area in addition to being thin and brittle. In such cases a lack of homogeneity can lead to damage to the components. In addition, in respect of the size of the components that are to be clamped, the pressure element can be scaled to any desired extent. The advantage of the clamping assembly according to the invention can accordingly be applied to components of any size.

Through the use of the pressure element containing the metal foam material, the additional effect of damping vibrations of the arrangement can be achieved. In comparison to a solid material, the damping properties of the metal foam material can be higher by a factor of 2-3. This can, in particular, be advantageous for applications in high-voltage technology (for example in the transmission of high-voltage direct current), where, as a result of high-frequency excitation of the components, the arrangement in general is made to vibrate and is thereby stressed mechanically.

A foam based on, for example, steel, aluminum or titanium oxide may be considered for the metal foam material. The metal foam material can be manufactured by means of a powder-metallurgical method known to the expert. In one such method, a metal powder (aluminum, for example) is mixed with a gas-evolving propellant (titanium hydride, for example). The powder mixture is then compressed, and converted to foam in a heat treatment process. The manufacture of the metal foam material by means of a fusion-metallurgical method, also known to the expert, may also be considered. Methods for the manufacture of a metal foam material are described, for example, in document DE 10 2006 031 213 B3. In the known methods, the number and/or the size of pores developing in the metal foam, as well as their size and thereby also the elastic properties of the metal foam material, can be chosen with almost no restriction.

The elastic properties can, for example, be characterized or quantified by the modulus of elasticity. As the proportion of pores by volume rises, the modulus of elasticity of the metal foam material correspondingly falls, and with it the stiffness.

According to a preferred form of embodiment of the invention, the pressure element contains a plurality of metal foam materials with different elastic properties. Through a suitable spatial arrangement of the metal foam materials in the pressure element, the distribution of pressure over the area can be controlled particularly accurately, and matched to the particular application. In this context, a small modulus of elasticity indicates that the metal foam material has higher flexibility.

According to one particularly advantageous form of embodiment of the invention, the metal foam materials in the pressure element form partial regions that are arranged in such a way that the stiffness of the partial regions rises from the inside to the outside with respect to a central axis of the arrangement. A particularly homogeneous transmission of the compressive force can be achieved with this spatial arrangement of the partial regions.

According to a further advantageous form of embodiment of the invention, the arrangement comprises at least one semiconductor element, wherein the semiconductor element comprises press-pack semiconductors arranged in parallel (in this connection see, for example, document EP 1 403 923 A1). The semiconductor element thus is composed of semiconductor modules arranged side-by-side. The semiconductor modules form a parallel circuit of electrical components. This can, for example, involve IGBT semiconductors, diodes or thyristor elements, or correspondingly composite modules having their own housing. The surface of such semiconductor modules can, for example, have a diameter of between 6 and 9 mm. The surface area of the components to be compressed can be between 400 and 1000 $cm^2$.

To cool the semiconductor element, the arrangement furthermore advantageously comprises at least one cooling plate of electrically conductive material, wherein the at least one cooling plate is arranged lying against the semiconductor element, so that there is an electrical contact between the semiconductor element and the cooling plate. The cooling plate is used to dissipate the heat arising in the semiconductor element. This heat arises in particular through the forward electrical resistance of the semiconductor element. The cooling plate appropriately consists of a material that is also thermally conductive, preferably a material with a thermal conductivity of more than 200 W/(mK), such as for example a metal or a metal alloy.

The arrangement can also comprise a plurality of semiconductor elements arranged on top of one another, wherein at least one cooling plate is assigned to each of the semiconductor elements, and the semiconductor elements constitute an electrical series circuit.

It is particularly preferred if two cooling plates are assigned to each semiconductor element, and are arranged on both sides of the respective semiconductor element. In this way the heat can be removed on both sides of the semiconductor element. Since the cooling plates are manufactured of electrically conductive material, the electrical contact between the semiconductor elements can be established by means of the cooling plates.

It is considered particularly advantageous for a further improvement of the homogeneity of the transmission of the compressive force, to provide a pressure counter-element that is arranged on the opposite side of the arrangement of the components to the pressure element. The pressure counter-element can, but does not have to, have the same construction as the pressure element. In particular, both can be formed conically, as truncated cones, trapezoidally or in any other suitable form.

The invention relates furthermore to a sub module of a converter with at least one series circuit of power semiconductor switching units, each of which comprises a power semiconductor that can be switched on and off having the same forward conduction direction, and each of which is conductive in the direction opposite to the said forward direction, and an energy store arranged connected in parallel with it. An example of such a sub module is known from DE 101 030 31 A1.

On the basis of the known sub module, it is a further object of the invention to propose a sub module of the type described above that has the lowest possible tendency to fail.

The object is achieved according to the invention through a generic sub module in which the series circuit of the power semiconductor switching units is implemented in a previously described clamping device.

Through the use of the pressure element according to the invention, the risk of damage, and thus of a fault in the semiconductor as result of non-homogeneous pressure distribution, is reduced.

BRIEF DESCRIPTION OF THE SEVERAL VIEWS OF THE DRAWING

The invention is explained below in more detail with reference to an exemplary embodiment illustrated in FIGS. 1 to 2.

FIG. 1 shows a schematic representation of a cross-section of an exemplary embodiment of a clamping assembly according to the invention.

FIG. 2 shows a schematic representation of an exemplary embodiment of a sub module according to the invention.

DESCRIPTION OF THE INVENTION

A schematic side view of a clamping assembly 1 according to the invention is shown in particular in FIG. 1. The clamping assembly 1 comprises an arrangement 2 of components 3, 4, 5, 6, 7 arranged above one another in a stack which have to be clamped together mechanically. In the exemplary embodiment of the invention illustrated in FIG. 1, the components 4 and 6 are semiconductor elements. The components 3, 5 and 7 are cooling plates that are manufactured of an electrically and thermally conductive material. Between the components 3-7 of the arrangement 2 there is thus a conductive connection, so that the components, and in particular the semiconductor modules 4, 6, constitute an electrical series circuit. The components 3-7 of the arrangement 2 are clamped together, in that a mechanical force generated by a clamping apparatus 30, is exercised on the arrangement 2 from both face sides. The clamping apparatus can, for example, be implemented in the form of a screw mechanism. The direction of the mechanical force generated by the clamping apparatus is indicated in FIG. 1 through the reference signs 8 and 9. The transmission of the mechanical force to the clamping assembly 1 is performed by means of a pressure element 10 and a pressure counter-element 11. In the exemplary embodiment of the clamping assembly 1 illustrated in FIG. 1, the clamping assembly 1 has a circular base area. For this reason, the pressure element 10 and the pressure counter-element 11 have the form of truncated cones.

The pressure element 10 contains metal foam materials, wherein the metal foam materials form five partial regions 12-16. The partial regions 12, 13, 14, 15 and 16 are arranged in such a way that they partially enclose each other. Partial region 12 is here partially enclosed by partial region 13, partial region 13 and partial region 14 and, correspondingly, partial region 15, by partial region 16. A metal foam material is assigned to each partial region 12-16, wherein the metal foam materials differ from one another in particular in their moduli of elasticity.

The metal foam material in partial region 12 here has the lowest modulus of elasticity. This corresponds to a highest gas content, i.e. a lowest stiffness, of all the partial regions. Accordingly, the modulus of elasticity of the metal foam materials rises in partial regions 13-16 from inside to outside with respect to a central or symmetrical axis 17 of the clamping assembly.

The pressure counter-element 11 is arranged opposite the pressure element 10. The construction of the pressure counter-element 11 mirrors that of pressure element 10. The pressure counter element 11 thus comprises partial regions 18, 19, 20, 21, 22, to each of which a metal foam material is assigned. The partial regions 18-22 differ from one another in the metal foam materials that they contain. Each of the metal foam materials exhibits a modulus of elasticity which, corresponding to that of pressure element 10, exhibits a rising value from the inside to the outside with reference to the axis 17.

An exemplary embodiment of a sub module 23 according to the invention is illustrated in FIG. 2. The sub module 23 is constructed as a two-terminal network, wherein the poles (the terminals) of the sub module 23 are identified in FIG. 2 with reference signs 24 and 25 respectively. The sub module 23 constitutes a part of a converter, not shown graphically in FIG. 2, wherein a plurality of further sub modules 23, with the same construction as that of sub module 23, are connected in series to form a converter phase branch. Sub module 23 comprises a series circuit of power semiconductor switching units 26, wherein each of the two power semiconductor switching units 26 consists of a power semiconductor switch 27 and a diode 28 connected in parallel with it but in the opposite sense. The sub module 23 further comprises a storage capacitor 29, which is arranged in parallel with the series circuit of the power semiconductor switching units 26. The series circuit of the power semiconductor switching units 26 is implemented in the form of a clamping assembly 1 illustrated in FIG. 1.

LIST OF REFERENCE SIGNS

1 Clamping assembly
2 Arrangement of components
3-7 Component
8, 9 Arrow
10 Pressure element
11 Pressure counter-element
12-16 Partial region
17 Central axis
18-22 Partial region
23 Sub module 24, 25 Terminal
26 Power semiconductor switching unit
27 Power semiconductor switch
28 Diode
29 Energy store

The invention claimed is:

1. A clamping assembly, comprising:
 a configuration of mechanically clamped components positioned above one another in a stack;
 a clamping device for generating a mechanical compressive force on said configuration of said components; and
 a pressure element for transferring the mechanical compressive force from said clamping device to said configuration, said pressure element containing a metal foam material, said pressure element being conical.

2. The clamping assembly according to claim 1, wherein said metal foam material is one of a plurality of metal foam materials with different elastic properties in said pressure element.

3. The clamping assembly according to claim 1, wherein said configuration includes a semiconductor element.

4. The clamping assembly according to claim 3, wherein said configuration includes at least one cooling plate formed of conductive material, said at least one cooling plate lying against said semiconductor element and providing an electrical contact between said semiconductor element and said at least one cooling plate.

5. The clamping assembly according to claim 4, wherein said semiconductor element is one of a plurality of semiconductor elements of said configuration, at least one cooling plate is associated with each respective semiconductor element, and said semiconductor elements form an electrical series circuit.

6. The clamping assembly according to claim 5, wherein two cooling plates are associated with each respective semiconductor element and are disposed on both sides of said semiconductor element.

7. A sub module of a converter, the sub module comprising:
 at least one series circuit of power semiconductor switching units;
 each of said power semiconductor switching units including a respective power semiconductor configured to be switched on and off and configured to have the same forward conduction direction;
 said power semiconductor switching units being conductive in a direction opposite to said forward direction;
 an energy storage device connected in parallel with said at least one series circuit; and
 said at least one series circuit being implemented as a clamping apparatus according to claim 1.

8. A clamping assembly, comprising:
 a configuration of mechanically clamped components positioned above one another in a stack;
 a clamping device for generating a mechanical compressive force on said configuration of said components; and
 a pressure element for transferring the mechanical compressive force from said clamping device to said configuration, said pressure element containing a metal foam material, said metal foam material being one of a plurality of metal foam materials with different elastic properties in said pressure element;
 said configuration having an inside and an outside disposed along a central axis, said metal foam materials in said pressure element forming partial regions, and said partial regions each having a different stiffness rising from said inside to said outside along said central axis of said configuration.

9. The clamping assembly according to claim 8, wherein said central axis extends in a clamping direction of the clamping assembly.

* * * * *